(12) United States Patent
Matsuki et al.

(10) Patent No.: US 7,470,633 B2
(45) Date of Patent: Dec. 30, 2008

(54) METHOD OF FORMING A CARBON POLYMER FILM USING PLASMA CVD

(75) Inventors: Nobuo Matsuki, Tama (JP); Yoshinori Morisada, Tama (JP); Seijiro Umemoto, Tama (JP); Jea Sik Lee, Tama (JP)

(73) Assignee: ASM Japan K.K., Tokyo (JP)

( * ) Notice: Subject to any disclaimer, the term of this patent is extended or adjusted under 35 U.S.C. 154(b) by 106 days.

(21) Appl. No.: 11/524,037

(22) Filed: Sep. 20, 2006

(65) Prior Publication Data

US 2007/0218705 A1    Sep. 20, 2007

Related U.S. Application Data

(63) Continuation-in-part of application No. 11/172,031, filed on Jun. 30, 2005.

(60) Provisional application No. 60/599,893, filed on Aug. 9, 2004.

(51) Int. Cl.
*H01L 21/31* (2006.01)

(52) U.S. Cl. ............... 438/780; 438/680; 438/758; 257/E21.035; 257/E21.27

(58) Field of Classification Search ............. 438/680, 438/758, 780
See application file for complete search history.

(56) References Cited

U.S. PATENT DOCUMENTS

| | | | | |
|---|---|---|---|---|
| 4,913,994 A | * | 4/1990 | Osawa et al. | 430/58.1 |
| 5,470,661 A | * | 11/1995 | Bailey et al. | 428/408 |
| 5,846,859 A | | 12/1998 | Lee | |
| 5,869,135 A | | 2/1999 | Vaeth et al. | |
| 6,428,894 B1 | | 8/2002 | Babich et al. | |
| 2006/0084280 A1 | | 4/2006 | Matsuki et al. | |
| 2007/0248767 A1 | | 10/2007 | Okura et al. | |

FOREIGN PATENT DOCUMENTS

JP    2006-52398    2/2006

* cited by examiner

*Primary Examiner*—Alexander G Ghyka
(74) *Attorney, Agent, or Firm*—Knobbe, Martens, Olson & Bear

(57) ABSTRACT

A method forms a hydrocarbon-containing polymer film on a semiconductor substrate by a capacitively-coupled plasma CVD apparatus. The method includes the steps of: vaporizing a hydrocarbon-containing liquid monomer ($C_\alpha H_\beta X_\gamma$, wherein $\alpha$ and $\beta$ are natural numbers of 5 or more; $\gamma$ is an integer including zero; X is O, N or F) having a boiling point of about 20° C. to about 350° C.; introducing the vaporized gas into a CVD reaction chamber inside which a substrate is placed; and forming a hydrocarbon-containing polymer film on the substrate by plasma polymerization of the gas.

15 Claims, 6 Drawing Sheets

METHOD OF FORMING A CARBON POLYMER FILM USING PLASMA CVD

CROSS-REFERENCE TO RELATED APPLICATIONS

This application is a continuation-in-part of U.S. patent application Ser. No. 11/172,031, filed Jun. 30, 2005, which claims the benefit of U.S. Provisional Application No. 60/599,893, filed Aug. 9, 2004, and the disclosure of which is herein incorporated by reference in its entirety.

BACKGROUND OF THE INVENTION

1. Field of the Invention

The present invention relates to a method of forming a carbon polymer film by plasma CVD using a hydrocarbon-containing material having high molecular weight, and more particularly to a method of utilizing the carbon polymer film as a hard mask for semiconductor processing.

2. Description of the Related Art

In semiconductor processing techniques, optical films such as antireflective films and hard masks are used. In conventional techniques, these films are formed mainly by a technique called a coating method. The coating method forms highly functional polymer films by coating a liquid material and sintering it. It is, however, difficult to form a thin film on a substrate because a liquid having viscosity is coated. As semiconductor chip sizes continue to shrink, more thinned and higher-strength films are required.

As an advantageous method for achieving thinner films, use of a DLC diamond-like carbon film or an amorphous carbon film by plasma CVD has been reported (e.g., U.S. Pat. No. 5,470,661, U.S. Pat. No. 6,428,894). In these cases, using a molecule which is gaseous at room temperature as a material, a diamond-like carbon film or an amorphous carbonous film is formed by decomposing the molecule by plasma. Using a plasma CVD method gives promise of facilitating to achieve thinner films.

SUMMARY OF THE INVENTION

An embodiment of the present invention includes a method of forming a polymer film capable of having a wide variety of structures, which is an advantage of a coating method by plasma CVD, and using the thin polymer film formed as a hard mask for semiconductor processing. Polymer materials produced from organic monomers having high molecular weight such as benzene actualize a wide variety of structures and characteristics and are widely and industrially used as high-strength materials and various highly-functional materials. By plasma polymerizing these organic monomers (e.g., by including them in reaction gas as a source gas), it becomes possible to form a thin-film hard mask having excellent characteristics.

Additionally, in an embodiment, a liquid organic monomer is a hydrocarbon-containing monomer with carbon number five or more, which is not substituted by a vinyl group or an acetylene group. Additionally, according to an embodiment, a liquid organic monomer is a carbon polymer film formed on a semiconductor device substrate and its intended use is no object.

According to still an embodiment of the present invention, a liquid organic monomer may not be substituted by a vinyl group or an acetylene group; for example, an organic polymer film can be formed from benzene substituted by a methyl group or an ethyl group.

Additionally, in an embodiment of the present invention, a liquid organic monomer is composed of hydrocarbon only and does not contain oxygen, silicon, fluorine, nitrogen, etc. Additionally, in an embodiment, a reaction gas is composed of an inert gas and an additive gas in addition to a liquid organic monomer. In an embodiment, a reaction gas is composed of a liquid organic monomer only. Further, in an embodiment, a reaction gas is composed of a liquid organic monomer and an inert gas. Still in an embodiment, a reaction gas is composed of a liquid organic monomer and an additive gas. Additionally, linking liquid organic monomers, an additive gas may become a main structure of a hydrocarbon-containing polymer film.

In the above, in CVD where the liquid monomer having a benzene structure is used, a stable polymer having a density of approximately 0.9-1.2 g/cm$^3$ can be formed by significantly incorporating the benzene structure into the polymer structure. However, in that case, because the benzene structure which is a porous structure constitutes a basal structure, it may be difficult to form a high density polymer having a density of more than 1.2 g/cm$^3$.

In an embodiment, by using a hydrocarbon monomer having no benzene structure, a high density carbon polymer having a density of more than 1.2 g/cm$^3$ (1.3 g/cm$^3$ or higher) can be formed.

In an embodiment, the liquid organic monomer is a hydrocarbon monomer having five or more carbons and contains at least one unsaturated carbon bond. In an embodiment, the polymer is a polymer film formed on a semiconductor substrate, and no limitation is imposed on its intended use or purposes.

In another embodiment, as the liquid organic monomer, a monomer containing no unsaturated carbon bond can be used. In an embodiment, the liquid organic monomer consists of hydrocarbon and contains none of O, Si, F, and N in the monomer. In an embodiment, the source gas is exclusively the liquid organic monomer. In an embodiment, in addition to the liquid organic monomer, an inert gas and/or an additive gas is used.

Because most of monomers having high molecular weight have low vapor pressure and are liquid at room temperature, they need to be vaporized in order to introduce them into a reaction chamber. In an embodiment of the present invention, use of liquid monomers is made it possible by preventing monomers from recondensing by providing a heater/vaporizer for vaporizing liquid monomers, and heating and keeping gas piping from the vaporizer to a reactor and a shower plate inside a reaction space at a given temperature.

Further according to an embodiment of the present invention, after being introduced into a reactor, organic monomers are polymerized by a polymerization reaction by plasma to make it possible to form an organic carbon polymer film on a substrate surface, and it becomes possible to use the film formed as a hard mask for semiconductor processing. A carbon polymer film formed by plasma CVD has excellent characteristics as an optical film because it facilitates to form a thin film having transparency.

The present invention is not limited to the above-mentioned advantages, objects or embodiments. In the present invention, it is to be understood that not necessarily all such objects or advantages may be achieved in accordance with any particular embodiment of the invention, Thus, for example, those skilled in the art will recognize that the invention may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

Figures are referred to when preferred embodiments of the present invention are described, but the present invention is not limited to these figures and embodiments. The figures are oversimplified for illustrative purposes and are not to scale.

DETAILED DESCRIPTION OF THE PREFERRED EMBODIMENT

Figure 1:
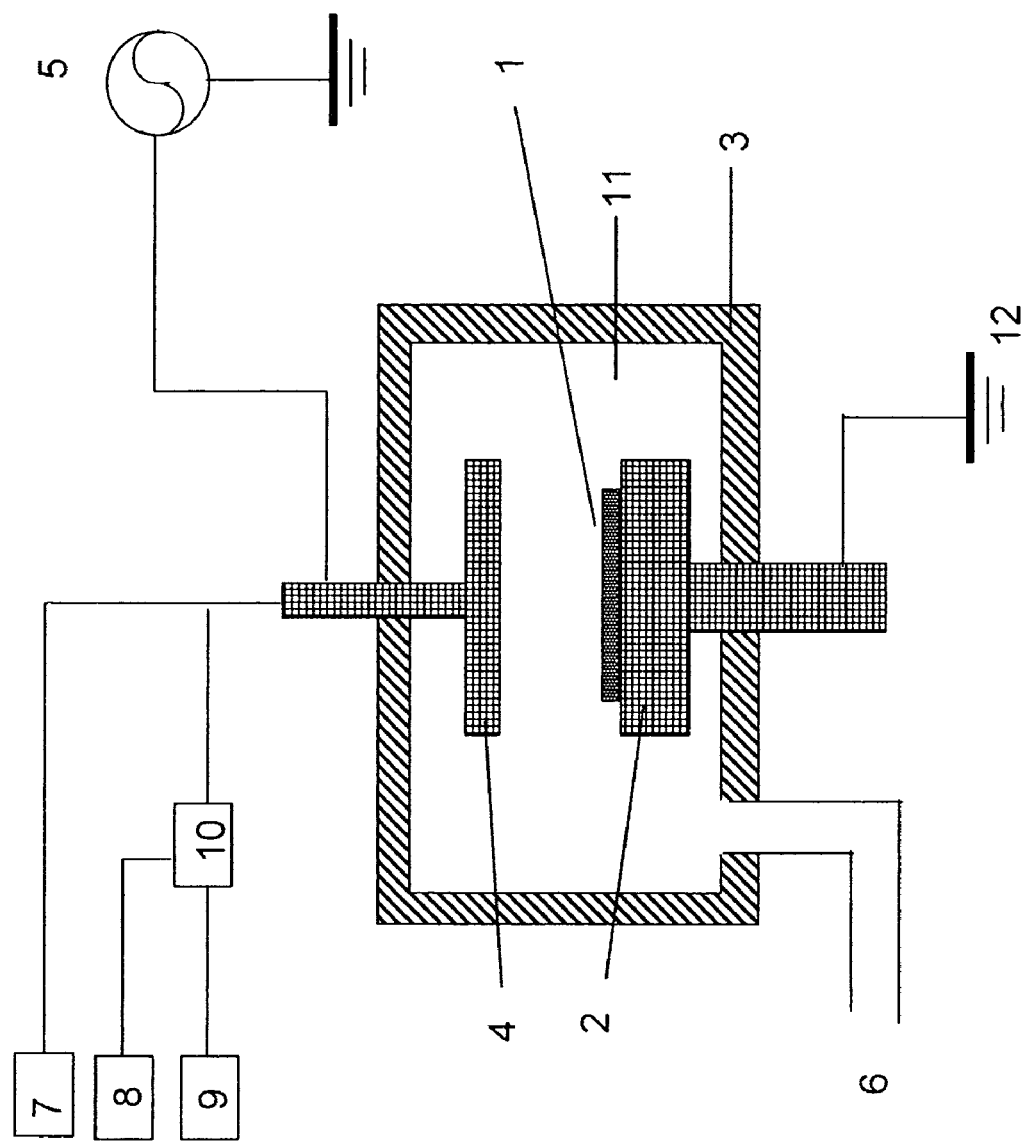
FIG. 1 is a schematic view showing an example of a CVD apparatus which can be used in an embodiment of the present invention.

The present invention is described in detail using preferred embodiments. The present invention, however, is not limited to these embodiments. Additionally, a requirement in an embodiment is freely applicable to other embodiments, and requirements are mutually replaceable unless special conditions are attached.

According to an embodiment, in a method of forming a hydrocarbon-containing polymer film on a semiconductor substrate by a capacitively-coupled plasma CVD apparatus, the present invention provides the above-mentioned method which comprises the steps of vaporizing a hydrocarbon-containing liquid monomer ($C_\alpha H_\beta X_\gamma$, wherein α and β are natural numbers of 5 or more; γ is an integer including zero; X is O or N) having a boiling point of 20° C.-350° C. (which may or may not be substituted by a vinyl group or an acetylene group), introducing the vaporized gas into a CVD reaction chamber inside which a substrate is placed, and forming a hydrocarbon-containing polymer film on the substrate by plasma polymerizing the gas. The substrate is, for example, a semiconductor device substrate.

Additionally, according to another embodiment, in a method of forming a hydrocarbon-containing polymer film on a semiconductor substrate by a capacitively-coupled plasma CVD apparatus, the present invention provides the above-mentioned method which comprises the steps of placing a semiconductor device substrate inside a CVD reaction chamber, vaporizing a hydrocarbon-containing liquid monomer ($C_\alpha H_\beta X_\gamma$, wherein α and β are natural numbers of 5 or more; γ is an integer including zero; X is O or N, F) having a boiling point of 20° C. to 350° C. (which may or may not be substituted by a vinyl group or an acetylene group), introducing the vaporized gas into the CVD reaction chamber inside which the substrate is placed, and forming a hard mask composed of a hydrocarbon-containing polymer film on the substrate by plasma polymerizing the gas.

Further, according to still another embodiment, in a method of forming a hydrocarbon-containing polymer film on a semiconductor substrate by a capacitively-coupled plasma CVD apparatus, the present invention provides the above-mentioned method which comprises the steps of introducing a hydrocarbon-containing liquid monomer ($C_\alpha H_\beta X_\gamma$, wherein α and β are natural numbers of 5 or more; γ is an integer including zero; X is O or N, F) having a boiling point of 20° C. to 350° C. into a heater through a flow control valve, and further through a shutoff valve provided downstream of the flow control valve and kept at approximately 80° C. or lower and vaporizing it, introducing the vaporized gas into the CVD reaction chamber inside which the substrate is placed, and forming a hydrocarbon-containing polymer film on the substrate by plasma polymerizing the gas. Additionally, the liquid monomer may be mixed with an inert gas downstream of the shutoff valve and upstream of the heater; additionally, after film formation is completed, a step of blocking inflow of the liquid monomer to the heater by shutting off the shutoff valve may be included. Additionally, after the shutoff valve is shut off, inside the heater may be purged by an inert gas.

In one or more than one of the above-mentioned embodiments, the liquid monomer may be introduced into a heater disposed upstream of the reaction chamber and vaporized. Additionally, the liquid monomer may be flow-controlled by a valve upstream of the heater, and introduction of the liquid monomer into the heater may be blocked by a shutoff valve disposed between the flow control valve and the heater and kept at 80° C. or lower or at a temperature lower than that of heating/vaporization by approximately 50° C. or more except when a polymerized material is formed. Or, the liquid monomer may be flow-controlled by a valve disposed upstream of the heater and kept at 80° C. or lower or at a temperature lower than that of heating/vaporization by approximately 50° C. or more, and at the same time introduction of the liquid monomer into the heater may be blocked except when a polymerized material is formed.

In another embodiment, the liquid monomer has no benzene structure (i.e., no benzene, benzene derivatives, or benzene ring), and the non-benzene liquid monomer is effective in increasing a density of a polymer film. The non-benzene liquid monomer may be cyclic or non-cyclic. The non-benzene liquid monomer may be saturated or unsaturated. The non-benzene liquid monomer can be any one of the foregoing or any combination thereof. In one of preferred embodiments, the liquid monomer is a non-cyclic hydrocarbon-containing monomer having at least one reactive group such as an unsaturated carbon bond. An unsaturated carbon bond is preferred because a molecule having an unsaturated carbon bond has a higher ratio of carbon to hydrogen as compared with a molecule having no unsaturated carbon bond. In another embodiment, the unsaturated carbon enhances polymerization so as to increase film density. Thus, in an embodiment, a molecular having a high carbon content is preferred regardless of whether the molecular has a saturated or unsaturated bond.

In embodiments using any one of the above-mentioned valves as well, the liquid monomer may be mixed with an inert gas downstream of the valve and upstream of the heater.

Additionally, in one or more of the above-mentioned embodiments, a step of introducing an inert gas may be performed before the plasma polymerization.

Apparatus Configuration

FIG. 1 is a schematic view of an apparatus combining a vaporizer and a plasma CVD reactor, which can be used in the present invention. An apparatus which can be used in the present invention is not limited to an example shown in FIG. 1.

In this example, by providing a pair of electrically conductive flat-plate electrodes 4, 2 in parallel and facing each other inside a reaction chamber 11, applying RF power 5 to one side, and electrically grounding 12 the other side, plasma is excited between the electrodes. A temperature regulator is provided in a lower stage 2, and a temperature is kept constantly at a given temperature in the range of 0° C.-650° C. to regulate a temperature of a substrate 1 placed thereon. An upper electrode 4 serves as a shower plate as well, and reaction gas is introduced into the reaction chamber 11 through the shower plate. Additionally, in the reaction chamber 11, an exhaust pipe 6 is provided through which gas inside the reaction chamber 11 is exhausted.

Figure 2:
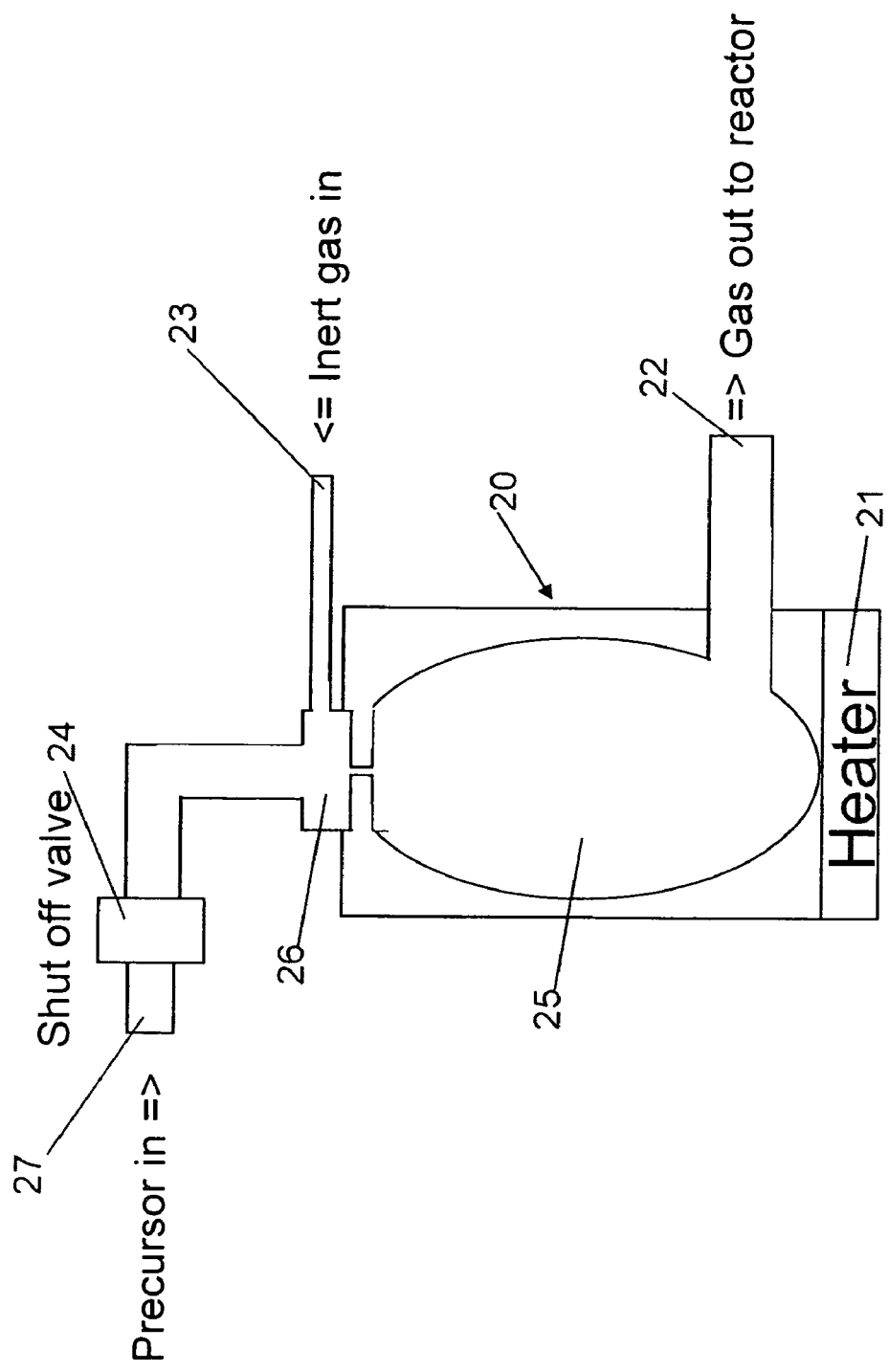
FIG. 2 is a schematic view showing an example of a heater/vaporizer which can be used in an embodiment of the present invention.

A vaporizer 10 (one example is shown in FIG. 2) which vaporizes a liquid organic monomer has an inlet port for a liquid and an inlet port for an inert gas in an embodiment and comprises a mixing unit for mixing these gases and a unit for heating the mixture. In the embodiment shown in FIG. 1, an inert gas is introduced from an inert gas flow-controller 8 to the vaporizer 10; and a liquid monomer is introduced from a liquid monomer flow-controller 9 into the vaporizer 10. A heating temperature for the mixture is determined by a vapor pressure characteristic of the liquid monomer; in an embodiment, a temperature is kept in the range of 30° C.-350° C. Vaporized gas is introduced into the reactor through gas piping. Additionally, the embodiment shown in FIG. 1 is designed to be able to introduce an additive gas including an inert gas from a gas flow-controller 7 into the reactor. Additionally, an inert gas can also be introduced into the reactor without passing through the vaporizer 10. The number of the gas flow-controller 7 is not limited to one, but can be provided appropriately to meet the number of gas types used.

The piping introducing the gas from the vaporizer to the reactor and a showerhead unit in an upper portion of the reactor are heated/temperature-controlled at a given temperature in the range of 30° C.-350° C. by a heater and their outer side is covered by an insulating material.

Liquid Organic Monomer

As a liquid organic monomer used in an embodiment of the present invention as a source gas, a hydrocarbon-containing liquid monomer ($C_\alpha H_\beta X_\gamma$, wherein $\alpha$ and $\beta$ are natural numbers of 5 or more; $\gamma$ is an integer including zero; X is O, N or F) having a boiling point of room temperature or higher (e.g., 20° C.-350° C.) which may or may not be substituted by a vinyl group or an acetylene group. Preferably, the carbon number is 6-30 (or 5-30); in an embodiment, the carbon number is 6-12 (or 5-12). Additionally, a boiling point is preferably approximately 30° C.-approximately 350° C.; in another embodiment, it is approximately 50° C.-approximately 200° C.; and in still another embodiment, it is approximately 100° C. or higher. The liquid monomer is cyclic hydrocarbon in an embodiment. The cyclic hydrocarbon may or may not be substituted or non-substituted benzene. Preferably, the cyclic hydrocarbon is not a benzene or benzene derivative. Further, the substituted or non-substituted benzene may be $C_6H_{6-n}R_n$ (wherein n, 0, 1, 2, 3); R may be independently —CH3 or —C2H5. In an embodiment, the liquid monomer is a combination of two types or more of substituted or non-substituted benzene.

In the above, the substituted benzene may be any one of 1.3.5-trimethylbenzene, o-xylene, m-xylene or p-xylene; in addition to a benzene derivative, the cyclic hydrocarbon may be any one of cyclohexane, cyclohexene, cyclohexadiene, cyclooctatetraene, pentane, iso-pentane, or neo-pentane. In an embodiment, the liquid monomer may be linear hydrocarbon, and the linear hydrocarbon may also be hexane.

Additionally, in an embodiment, the liquid monomer hydrocarbon wherein $\gamma$ is equal to zero. In an embodiment, a reaction gas may be composed of only the liquid monomer.

As a specific example, C6H3 (CH3)3 (1.3.5-trimethylbenzene (TMB); boiling point of 165° C.) or C6H4(CH3)2 (dimethylbenzene (xylene); boiling point of 144° C.) can be mentioned. In addition to the above, as liner alkane ($C_nH_{2(n+1)}$), pentane (boiling point of 36.1° C.), iso-pentane (boiling point of 27.9° C.) or neo-pentane (boiling point of 9.5° C.), wherein n is 5, or hexane (boiling point: 68.7° C.), wherein n is 6 can be used as a source gas.

Additionally, in another embodiment, a liquid organic monomer is a hydrocarbon-containing liquid monomer ($C_\alpha H_\beta X_\gamma$, wherein $\alpha$ and $\beta$ are natural numbers of 5 or more; $\gamma$ is an integer including zero; X is O, N or F) having a boiling point of room temperature or higher (e.g., approximately 20° C.-approximately 350° C.). Using this monomer, a hard mask is formed. Preferably, the carbon number is 6-30 (or 5-30); the carbon number is 6-12 (or 5-12) in an embodiment. A boiling point is preferably approximately 30° C. to approximately 350° C.; it is 50° C. to approximately 350° C. in an embodiment; approximately 50° C. to approximately 200° C. in an embodiment, or approximately 100° C. or higher in an embodiment. In an embodiment, the liquid monomer is cyclic hydrocarbon, and in another embodiment, the cyclic hydrocarbon may also be substituted or non-substituted benzene. In the above, the substituted benzene or the non-substituted benzene may be $C_6H_{6-n}R_n$ (wherein n is 0, 1, 2, or 3); R may be independently —CH3, —C2H5, or —CH=CH2. Additionally, in an embodiment, the liquid monomer is a combination of two types or more of the non-substituted benzene.

In the above, the substituted benzene may be any one of 1,3,5-trimethylbenzene, o-xylene, m-xylene, or p-xylene; In addition to benzene derivatives, the cyclic hydrocarbon may be any one of cyclohexene, cyclohexadiene, cyclooctatetraene, pentane, iso-pentane, or neo-pentane. Additionally, it may be linear hydrocarbon; the linear hydrocarbon may be pentane, iso-pentane, neo-pentane, hexane, 1-pentene, 1-hexene, or 1-pentyne.

Additionally, in an embodiment, the liquid monomer is hydrocarbon wherein $\gamma$ is equal to zero. In an embodiment, a reaction gas composed of only the liquid monomer may be used.

In addition to this, as liner alkene (CnHn(n=5)), 1-Pentene (boiling point of 30.0° C.); or as liner alkyne ($CnH_{2(n-1)}$) (n=5), 1-Pentyne (boiling point of 40.2° C.), etc. can be used as a source gas.

In another embodiment, the liquid monomer is a hydrocarbon-based monomer having no benzene structure, having no unsaturated bond in the entire structure, having no unsaturated bond in side chains or substituents, or being non-cyclic, which monomer is a hydrocarbon-containing liquid monomer ($C_\alpha H_\beta X_\gamma$, wherein $\alpha$ and $\beta$ are natural numbers of 5 or more; $\gamma$ is an integer including zero; X is O, N or F) having a boiling point of room temperature or higher (e.g., 20° C.-350° C.). Preferably, the carbon number is 5-10; in an embodiment, the carbon number is 5-7. Additionally, a boiling point is preferably approximately 30° C.-approximately 350° C.; in another embodiment, it is approximately 50° C.-approximately 200° C. The liquid monomer is a hydrocarbon-containing monomer containing at least one unsaturated carbon bond in an embodiment. In an embodiment, the liquid monomer is a hydrocarbon monomer containing no unsaturated carbon bond.

The hydrocarbon monomer containing no unsaturated carbon bond is $C_nH_{2n+2}$ (n is a natural number of 5 or greater) in an embodiment. In another embodiment, the hydrocarbon monomer containing at least one unsaturated carbon bond is $C_nH_{2(n-m)+2}$ (n is a natural number of 5 or greater, m is a natural number of 1 or greater but smaller than n). In an embodiment, a liquid material containing the liquid monomer with unsaturated carbon further contains 10 ppm to 1,000 ppm (e.g., 100 ppm to 600 ppm) of an inhibiter consisting of C, H and O such as t-butylcatechol, 2,6-di-tert-butyl-4-methylphenol, and dibutylhydroxytoluene (BHT), in order to inhibit the liquid monomer from being polymerized in a tank and/or pipes upstream of the reaction chamber. In still another embodiment, two or more hydrocarbon monomers containing at least one unsaturated carbon bond, each being expressed as $C_nH_{2(n-m)+2}$ (n is a natural number of 5 or greater, m is a natural number of 1 or greater but smaller than n), can be used in combination. In an embodiment, the liquid monomer can be a mixture of at least one cyclic hydrocarbon-containing compound such as those explained in this disclosure and at least one non-cyclic hydrocarbon-containing compound such as those explained in this disclosure.

In the above, examples include, but are not limited to, isoprene(2-methyl-1,3-butadiene), $CH_2$=$C(CH_3)CH$=$CH_2$ (i.e., $C_5H_8$), having a boiling temperature of 35° C., a 2,3-methyl-1,3-butadiene, $CH_2$=$C(CH_3)C(CH_3)$=$CH_2$ (i.e., $C_6H_{10}$), having a boiling temperature of 68° C. Further, any one of organic monomers selected from the group consisting of 3-methyl-1,2-butadiene, $C_5H_{10}$ (e.g., 2-methyl-1-butene, 2-methyl-2-butene, or 3-methyl-1-butene), 1,4-methyl-1,3-butadiene, and 1,2-methyl-1,3-butadiene, can be used as a source gas.

In another embodiment, a liquid organic monomer is a hydrocarbon-containing liquid monomer ($C_\alpha H_\beta X_\gamma$, wherein α and β are natural numbers of 5 or more; γ is an integer including zero; X is O, N or F) having a boiling point of room temperature or higher (e.g., approximately 20° C.-approximately 350° C.). Using this monomer, a hard mask is formed. Preferably, the carbon number is 5-30; the carbon number is 5-8 in an embodiment. A boiling point is preferably approximately 30° C. to approximately 350° C.; it is 35° C. to approximately 100° C. in an embodiment. In this case as well, the liquid monomer is an unsaturated hydrocarbon. In an embodiment, the source gas is exclusively the liquid monomer.

Monomer Vaporization

A liquid monomer is a monomer which is liquid at room temperature. Depending on a structure and a boiling point of a liquid monomer, however, a means for preventing polymerization of the liquid monomer in a liquid phase from taking place is required.

When an organic monomer such as benzene and toluene having a boiling point (under one atmosphere) of 150° C. or lower and high vapor pressure, and not having a reactive group containing an unsaturated bond is used, because a polymerization phenomena and the like inside a vaporizer does not cause a problem, use of a method in which the liquid monomer is stored in a tank in advance, the tank storing the liquid monomer is heated, and gas vaporized by heating the tank is flow-controlled and supplied to a reactor is possible. In this case, there are both cases of introducing and not introducing an inert gas into a vaporizer.

When an organic monomer having a boiling point of 150° C. or more and low vapor pressure is used, and if the method of heating the tank is used, problems such as a phenomena which molecular weight of the liquid monomer is changed by a polymerization reaction taking place inside the tank, and caking because a monomer in a liquid phase is kept at a high temperature for a long time, occur. Because of this, by using a type of vaporizer which introduces a given flow rate of a liquid monomer equivalent to that of a monomer gas introduced into a reactor by a flow control unit into the vaporizer, the liquid monomer is heated and vaporized in a short time. In this case, there are both cases of introducing and of not introducing an inert gas into the vaporizer.

Additionally, particularly when a monomer having a boiling point of 170° C. or higher and low vapor pressure or a reactive group containing an unsaturated group such as a vinyl group is used, a means for preventing polymerization from taking place inside a vaporizer is required. In this case, there are both cases of introducing and of not introducing an inert gas into a vaporizer; but preferably an inert gas is introduced.

During film formation, a liquid monomer is constantly supplied into a vaporizer and is not heated and kept in a liquid phase for a long time. However, after the film formation is completed and between carrying out of a substrate on which a thin film has been formed and placing a next substrate inside a reactor, it is necessary to stop introducing the liquid monomer because the monomer is not supplied to the reactor. During this, the liquid monomer stays in a heater portion inside the vaporizer, and a polymerization reaction takes place inside the vaporizer.

In order to solve this problem, a function for shutting off liquid monomer supply is added upstream of a vaporizer portion so that liquid monomer penetration into the heater/vaporizer portion is prevented while the monomer is not supplied to the reactor. One example of embodiments is that a flow control portion is kept away from the heater/vaporizer portion to maintain a low temperature, and a function for shutting off liquid monomer supply is added to the flow control portion or a valve for shutting off liquid monomer penetration is provided in the flow control portion. An embodiment is shown in FIG. 2.

An inert gas is flow-controlled in the flow control unit (not shown) and the inert gas at a given flow rate is introduced from an inlet pipe 23 to a vaporizer 20. A precursor (liquid monomer) and the inert gas respectively are brought from respective inlet ports into a mixing unit 26 and are mixed, and a mixed gas is vaporized in a heater/vaporizer unit 25. The vaporized gas is sent into a reaction chamber via gas piping 22. A vaporization temperature of the mixed gas is determined by a vapor pressure characteristic of the liquid monomer, and controlled normally at a temperature in the range of 30° C.-350° C. A heater 21 is provided in the vaporizer.

In this vaporizer, a shutoff valve 24 is provided upstream of the mixing unit 26. The precursor is sent into the mixing unit 26 after going through the flow control unit (not shown) and the shutoff valve 24 through an inlet pipe 27. The shutoff valve 24 is temperature-controlled and is kept normally at approximately 80° C. or lower, or at a temperature which is lower than that of the heater/vaporizer unit 25 by approximately 50° C. or more (heating control, cooling control). When a temperature of the heater/vaporizer unit 25 is at 100° C. or lower, there is not much need to give consideration to a temperature of the shutoff valve. Additionally, even when a temperature of the heater/vaporizer unit 25 is at 100° C. or higher, the shutoff valve is naturally cooled without controlling a temperature if designed to be distanced from a high-temperature portion (i.e., temperature control in a broad sense). The shutoff valve 24 is closed during the film formation so as not to allow a liquid monomer to be introduced into the heater/vaporizer unit 25.

Although a liquid monomer is held upstream of the shutoff valve 24, it is difficult to cause a polymerization reaction while the liquid monomer is held by the shutoff valve 24 because a temperature of the shutoff valve 24 is kept at approximately 80° C. or lower, or at a temperature approximately 50° C. lower than that of the heater/vaporizer unit 25. Consequently, a temperature of the shutoff valve is sufficient as long as it does not cause a polymerization reaction of a liquid monomer while preserved, and which can be appropriately selected according to polymerization characteristics of a liquid monomer. Additionally, when a liquid monomer having a low boiling point and low vapor pressure is used, control of the shutoff valve can be unnecessary. Additionally, even when a liquid monomer having a high boiling point and high vapor pressure is used, there may be cases where control of the shutoff valve is unnecessary because a polymerization reaction of a liquid monomer in a vaporizer does not much matter when film formation is completed in a short time.

In an embodiment, the liquid monomer contains a reactive group such as an unsaturated group, e.g., a vinyl group. In that case, operation which inhibits polymerization of the liquid monomer is important, and preferably, a method of introducing an inert gas into the vaporizer (e.g., at 5 sccm to 5000 sccm, or 50 sccm to 1000 sccm) is employed.

In an embodiment such that where the liquid monomer is a non-benzene monomer with at least one reactive group, all or part of primary piping of a liquid control unit, a liquid supplier, piping from the liquid supplier to a liquid shut-off valve, and the liquid shut-off valve are subjected to cooling control to be cooled at 80° C. or lower or at 50° C. or lower. Further, in an embodiment, when the liquid monomer which is apt to polymerization, such as an unsaturated hydrocarbon, the cooling control may control all of part of the above portions nearly or substantially at room temperature (or about 30° C.) or lower. The cooling control can be conducted by supplying a cooling medium such as cooling water through piping or by using electronic elements.

In an embodiment such that where the liquid monomer is a non-benzene monomer, by designing a location of the shut-off valve away from a high temperature portion of the vaporizer, it is possible to inhibit thermal transfer from the vaporizer to the shut-off valve. The shut-off valve 24 is closed during a period when no film formation is conducted, thereby inhibiting the liquid monomer from flowing into the mixing unit 26. The shut-off valve 24, piping upstream of the shut-off valve, and the liquid control unit (not shown) are controlled at a temperature of about 80° C. or lower, in another embodiment, about 30° C. or lower, further in another embodiment, about 15° C. or lower, or at a temperature lower than that of heating/vaporization by approximately 50° C. or more except when a film is formed. The temperature of the shut-off valve may be set so that the liquid monomer does not start polymerization while the reaction chamber is not in operation. It may depend upon polymerization characteristics of the liquid monomer to be used.

Additionally, after the shutoff valve 24 is shut off, by continuously introducing the inert gas into the mixing unit 26 and the heater/vaporizer 25, inside the heater/vaporizer unit 25 can also be purged by the inert gas. By this, an amount of liquid monomer remaining inside the vaporizer and being on standby can be decreased, and an amount of liquid monomer which may cause a polymerization reaction can be minimized.

Additionally, a flow control function can be added to the shutoff valve; in this case, a separate flow control unit is not required or can be simplified. In an embodiment such that where the liquid monomer is a non-benzene monomer, the shut-off valve can be provided with a flow control function by providing a liquid flow meter upstream of the shut-off valve or providing a gas flow meter downstream of the vaporizer, so that flow control can be accomplished.

In an embodiment which does not require the shutoff valve, a tank type heater/vaporizer or a nozzle type heater/vaporizer can be used (e.g., U.S. Pat. Nos. 6,277,201, 6,699,524, 5,377, 616). A nozzle type vaporizer can also be provided inside a reaction chamber.

Flow Rate and Other Conditions

A flow rate of liquid monomer is not particularly restricted, but as a flow rate introduced into a reaction chamber after vaporization, in an embodiment, it is approximately 30 sccm to approximately 1000 sccm (50 sccm, 100 sccm, 150 sccm, 200 sccm, 300 sccm, 400 sccm, 500 sccm, and including a range defined by any one of foregoing values).

Additionally, an inert gas can be introduced into a reaction chamber. For example, the inert gas can be one of or a combination of two or more of Ar, He, Ne, Kr, Xe, and $N_2$; preferably Ar or/and He. A flow rate of an inert gas introduced into a reaction chamber is approximately 0 sccm to approximately 3000 sccm (30 sccm, 50 sccm, 100 sccm, 150 sccm, 200 sccm, 300 sccm, 500 sccm, 1000 sccm, 2000 sccm, and including a range defined by any one of foregoing values).

In an embodiment such that where the liquid monomer is a non-benzene monomer, a flow rate of an inert gas introduced into a reaction chamber is approximately 0 sccm to approximately 20,000 sccm (100 sccm, 300 sccm, 500 sccm, 1,000 sccm, 2,000 sccm, 3,000 sccm, 4,000 sccm, 8,000 sccm, and including a range defined by any one of foregoing values).

Additionally, in an embodiment, further as an additive gas, an organic gas $C_nH_m$ (wherein n is an integer of 4 or less including zero; m is any natural number) can also be introduced into a reaction chamber. Or, further as an additive gas, a dry gas containing N, O, and/or F can also be introduced into a reaction chamber. Additionally, as a reducing gas, hydrogen, ammonia, carbon monoxide, etc. can also be used as an additive gas. A flow rate of an additive gas introduced into a reaction chamber is approximately 0 sccm to approximately 300 sccm (30 sccm, 50 sccm, 100 sccm, 150 sccm, 200 sccm, and including a range defined by any one of foregoing values). In an embodiment such that where the liquid monomer is a non-benzene monomer, a flow rate of an additive gas introduced into a reaction chamber is approximately 0 sccm to approximately 600 sccm (30 sccm, 50 sccm, 100 sccm, 150 sccm, 200 sccm, 500 sccm, and including a range defined by any one of foregoing values).

Consequently, in an embodiment, an organic carbon polymer film is formed using only a hydrocarbon-containing monomer and an inert gas. Or, the film may be formed using only a hydrocarbon-containing monomer. Additionally, only a hydrocarbon-containing monomer and an inert gas, or a hydrocarbon-containing gas, an inert gas and an additive gas can be used. Additionally, in an embodiment, a flow rate of a gas other than a hydrocarbon-containing monomer is less than that of the hydrocarbon-containing monomer (gaseous), preferably less than a half that of the hydrocarbon-containing monomer (gaseous). In an embodiment such that where the liquid monomer is a non-benzene monomer, a flow rate of a gas other than a hydrocarbon-containing monomer is more than that of the hydrocarbon-containing monomer (gaseous), preferably about 10 times that of the hydrocarbon-containing monomer (gaseous).

Additionally, in an embodiment in which an inert gas is mixed in a heater/vaporizer, the inert gas may be introduced into a reaction chamber. Explanation of the above-mentioned inert gas to be introduced into the reaction chamber can apply to the inert gas as it is. In this case, in substitution for an inert gas introduced directly into the reaction chamber, an inert gas introduced through a vaporizer can be used. Additionally, an inert gas introduced directly into the reaction chamber and an inert gas introduced through the vaporizer can also be used together. In an embodiment, a flow rate of an inert gas introduced through the vaporizer is equal to or more than that of an inert gas introduced directly. Additionally, in an embodiment, the same type of inert gas is used for the one introduced through the vaporizer and the one introduced through the vaporizer; in another embodiment, different types of inert gases are used.

A plasma polymerization can be preformed in an embodiment under the conditions: a substrate temperature of approximately 0° C. to approximately 650° C. (including a range of 150° C.-450° C. and a range of 300° C.-400° C.), a reaction pressure of approximately 10 Pa-approximately 1500 Pa (including a range of 50 Pa-1000 Pa, a range of 100 Pa-500 Pa, and a range of 400 Pa-800 Pa in embodiments).

As to RF power density, a plasma polymerization step is preformed under the conditions of: RF power density of approximately 0.01 W/cm$^2$-approximately 20 W/cm$^2$ (per substrate area) (including a range of 0.05-10 W/cm$^2$, a range of 1-5 W/cm2, and a range of 0.5-5 W/cm$^2$ in embodiments).

Power per unit monomer is changed under various other conditions; a plasma polymerization step can be performed under the condition of 0.01-100 W/sccm (including a range of 0.05-50 W/sccm and a range of 3-20 W/sccm) in an embodiment; RF power can also be controlled per monomer unit flow rate. In another embodiment such that where the liquid monomer is a non-benzene monomer, a plasma polymerization step can be performed under the condition of 0.01-500 W/sccm (including a range of 1-100 W/sccm and a range of 3-50 W/sccm) in an embodiment.

Additionally, a plasma polymerization step can be performed using a frequency exceeding 5 MHz, e.g., any one of high RF frequency power of 13.56 MHz, 27 MHz or 60 MHz, in an embodiment; further, one of the foregoing high RF frequency power and low RF power of 5 MHz or less (including 2 MHz or less and 500 kHz or less) can be combined. In an embodiment, a ratio of low RF power is 50% or less, 30% or less, or 10% or less of high RF power.

A thickness of an organic polymer can be appropriately selected according to intended uses. In an embodiment, it is 50 nm-1000 nm or 100 nm-500 nm. A deposition rate differs depending on a liquid monomer used; in an embodiment, it is approximately 0.1-20 nm/sec.

A carbon polymer film obtained differs depending on a liquid monomer used; in an embodiment, a modulus is in the range of approximately 4-10 GPa or approximately 5-8 GPa. Additionally, hardness is in the range of approximately 0.1-2 GPa or approximately 0.3-1 GPa. In another embodiment such that where the liquid monomer is a non-benzene monomer, a modulus is in the range of approximately 15-200 GPa or approximately 30-70 GPa. Further, in another embodiment such that where the liquid monomer is a non-benzene monomer, a density of the polymer film may be approximately 1.2-2.2 g/cm$^3$, or approximately 1.3-1.7 g/cm$^3$. Additionally, in another embodiment such that where the liquid monomer is a non-benzene monomer, hardness is in the range of approximately 3-15 GPa or approximately 4-10 GPa.

Hard Mask Formation

Figure 4:
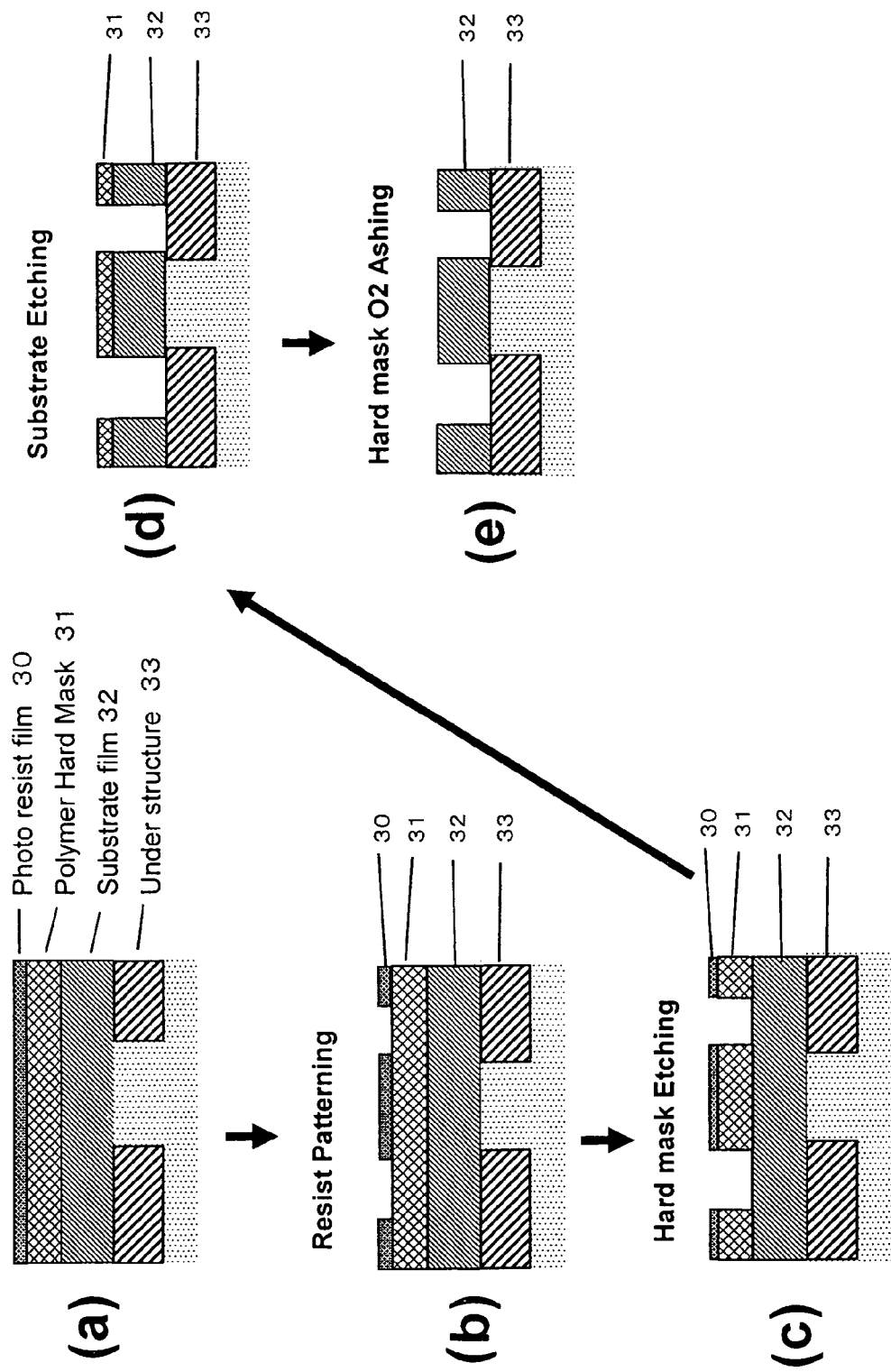
FIG. 4 is a process chart showing an example in which a hydrocarbon-containing polymer film formed in an embodiment of the present invention is used as a hard mask.

An example of hard mask formation and use is shown in FIG. 4. FIG. 4 (a) is a schematic view of a structure of a semiconductor device substrate which an organic carbon polymer film according to the present invention is formed as a hard mask. On an under structure 33 in which an electric circuit is formed, a substrate film 32 which is a dielectric film (Silicon oxide, SiOF, SiC, other low-dielectric-constant films, etc.), a capacitor material (SiN, Al$_2$O$_3$, HfO$_2$, Ta$_2$O$_3$, etc.), an electrode material, metal (Poly Si, TiN, TaN, Ru, Al, etc.), etc. is formed; on top of that, an organic carbon polymer film is formed as a hard mask 31. On top of that, a photo resist film 30 (photopolymer, etc.) is formed. Additionally, the present invention is not limited to this structure. Further, a structure may be a film-laminated structure; a dielectric film may be a low-k film formed by a spin-on process (rotary coating).

In FIG. 4 (b), the photo resist film 30 is etched into a given pattern; in FIG. 4 (c), the hard mask 31 is etched; after that, in FIG. 4 (d), the dielectric film 32 is etched; in FIG. 4 (e), the finally remaining hard mask 31 is removed by O$_2$ ashing, etc. By this, a dielectric film, etc. having a given pattern can be formed.

Reactor Cleaning and After-treatment

Additionally, after film formation on a substrate is completed, cleaning inner walls of a reaction chamber is desirable. For example, cleaning of a wall surface of the reaction chamber can be performed by introducing oxygen (O$_2$) and/or a mixture gas of CxFy (x and y are any natural numbers respectively) and an inert gas into the reaction chamber and generating plasma between electrodes; after film formation on a substrate is completed, cleaning of a wall surface of the reaction chamber can be performed by introducing a gas containing radical molecules containing O and/or F into the reaction chamber; or after film formation on a substrate is completed, cleaning of a wall surface of the reaction chamber can be performed by introducing a gas containing radical molecules containing O and/or F into a reaction chamber, generating plasma between electrodes.

Additionally, after cleaning a wall surface of the reaction chamber is completed, by introducing a reducing gas and reducing radical molecules into the reaction chamber and generating plasma between electrodes, removing fluoride on the wall surface of the reaction chamber can also be performed.

Further, in order to improve mechanical strength of a film, heat curing of the film formed can be performed by combining UV and EB.

Experimental Result 1

Examples of the present invention are explained below, but the present invention is not limited to these examples.

Common conditions: Common conditions in respective examples are as follows: Eagle®10 (ASM Japan) possessing a basic structure shown in FIG. 1 was used as a reactor; a heater/vaporizer shown in FIG. 2 was used. Additionally, in the case of these examples, although a liquid monomer was flow-controlled by a flow control unit in a liquid phase, an amount of gas introduced into a reactor was obtained by molar conversion from the flow rate of the liquid.

Reactor Settings
Temperature of upper electrode (shower plate): 190° C.
Size of shower plate: φ250 mm
(Size of substrate: φ200 mm)
Susceptor temperature: 430° C.
Temperature of vaporizer, vaporizer portion: 190° C.
Controlled temperature of gas inlet piping: 190° C.

EXAMPLE 1

Process Conditions in this Example and Film Formation Results are Shown as Follows Gap between shower plate and susceptor: 12 mm
Process Conditions:
TMB (1,3,5-trimethyl-benzene, C$_6$H$_5$(CH$_3$)$_3$): 70 sccm
He supplied to vaporizer: 50 sccm
Process gas He supplied to reactor: 50 sccm
Ar: 50 sccm
RF Power 27 MHz: 1400 W Pressure: 270 Pa
Film formation time: 70 sec
Film Formation Results:
Thickness: 200 nm
RI(n): 1.67
RI(k): 0.02 @633 nm
Modulus: 7 GPa
Hardness: 0.7 GPa
(Controllability of Thin Film Formation)

Figure 3:
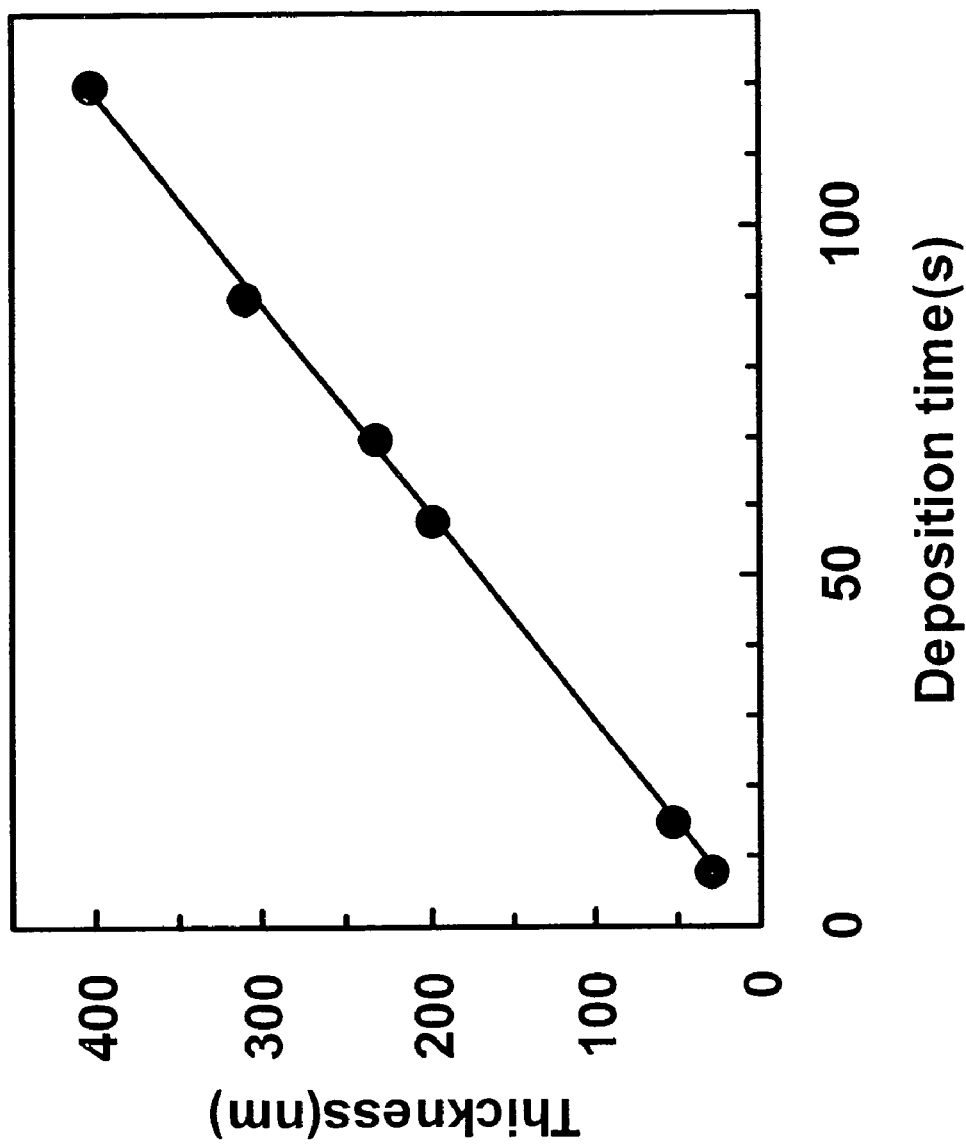
FIG. 3 is a graph showing an example of the relation between film formation time and a film thickness of a hydrocarbon-containing polymer film measured in an embodiment of the present invention.

Additionally, FIG. 3 shows relation of film formation time and a thickness of a film formed obtained under the same conditions as the above. A film thickness is proportional to the film formation time; it was confirmed that thin films having a thickness from approximately 30 nm to approximately 400 nm were formed with satisfactory controllability. Additionally, RI, modulus, hardness of carbon polymer films obtained were all satisfactory and it is seen that the carbon polymer films obtained are suitable for a hard mask.

EXAMPLE 2

Process Conditions in this Example and Film Formation Results are Shown as Follows Gap between shower plate and susceptor: 12 mm
Process Conditions:
TMB: 70 sccm
He supplied to vaporizer: 50 sccm
Process gas He supplied to reactor: 50 sccm
Ar: 50 sccm
RF Power 27 MHz: 1400 W
Pressure: 270 Pa
Film formation time: 18 sec
Film Formation Results:
Thickness: 50 nm
RI(n): 1.67
RI(k): 0.02 @633 nm
Modulus: 7 GPa
Hardness: 0.7 GPa

EXAMPLE 3

Process Conditions in this Example and Film Formation Results are Shown as Follows Gap between shower plate and susceptor: 24 mm
Process Conditions:
TMB: 280 sccm
He supplied to vaporizer: 50 sccm
Process gas He supplied to reactor: 50 sccm
Ar: 50 sccm
RF Power 27 MHz: 1400 W
Pressure: 270 Pa
Film formation time: 430 sec
Film Formation Results:
Thickness: 245 nm
RI(n): 1.82
RI(k): 0.015 @633 nm
Modulus: 5.6 GPa
Hardness: 0.4 GPa

EXAMPLE 4

Process Conditions in this Example and Film Formation Results are Shown as Follows Gap between shower plate and susceptor: 12 mm
Process Conditions:
Xyleme: 280 sccm
He supplied to vaporizer: 50 sccm
Process gas He supplied to reactor: 50 sccm X
RF Power 27 MHz: 1400 W
Pressure: 270 Pa
Film formation time: 800 sec
Film Formation Results:
Thickness: 200 nm
RI(n): 1.63
RI(k): 0.017
Modulus: 5.6 GPa
Hardness: 0.4 GPa

EXAMPLE 5

Process Conditions in this Example and Film Formation Results are Shown as Follows Gap between shower plate and susceptor: 12 mm
Process Conditions:
$C_6H_5(CH=CH_2)$: 250 sccm
He supplied to vaporizer: 50 sccm
Process gas He supplied to reactor: 50 sccm
RF Power 27 MHz: 500 W
Pressure: 270 Pa
Film formation time: 12 sec
Film Formation Results:
Thickness: 200 nm
RI(n): 1.67
RI(k): 0.012 @633 nm
Modulus: 6 GPa
Hardness: 0.5 GPa

INDUSTRIAL APPLICABILITY

According to at least one embodiment of the present invention, it becomes possible to form a polymer hard mask film by plasma CVD and processing of microscopic highly-integrated next-generation semiconductor devices is facilitated. At the same time, it becomes possible to supply reliable semiconductors inexpensively.

Experimental Result 2

Examples of the present invention are explained below, but the present invention is not limited to these examples.

Common conditions: Common conditions in respective examples are as follows: Eagle-12™ (ASM Japan) possessing a basic structure shown in FIG. 1 was used as a reactor; a heater/vaporizer shown in FIG. 2 was used. Additionally, in the case of these examples, although a liquid monomer was flow-controlled by a flow control unit in a liquid phase, an amount of gas introduced into a reactor was obtained by molar conversion from the flow rate of the liquid.

Reactor Settings
Temperature of upper electrode (shower plate): 150° C.
Size of shower plate: ϕ325 mm
(Size of substrate: ϕ300 mm)
Susceptor temperature: 350° C.
Gap between shower plate and susceptor: 16 mm The temperature of the vaporizer and that of the piping were selected based on the boiling point, the vaporizing pressure, etc. of the precursor used.

EXAMPLE 2-1

Process Conditions in this Example and Film Formation Results are Shown as Follows:

Process Conditions:
Precursor: 2,3-methyl-1,3-butadiene: 120 sccm
Ar supplied to vaporizer: 2 slm
Temperature of vaporizer, vaporizer portion: 80° C.
Controlled temperature of gas inlet piping: 100° C.
Process gas He supplied to reactor: 2 slm
RF Power 13.56 MHz: 1800 W
Pressure: 700 Pa
Film formation time: 54 sec
Film formation Results:
Thickness: 250 nm
RI(n)@633 nm: 1.86
RI(k)@633 nm: 0.08
Density: 1.39 g/cm$^3$
Modulus: 35 GPa
Hardness: 6 GPa

EXAMPLE 2-2

Figure 5:
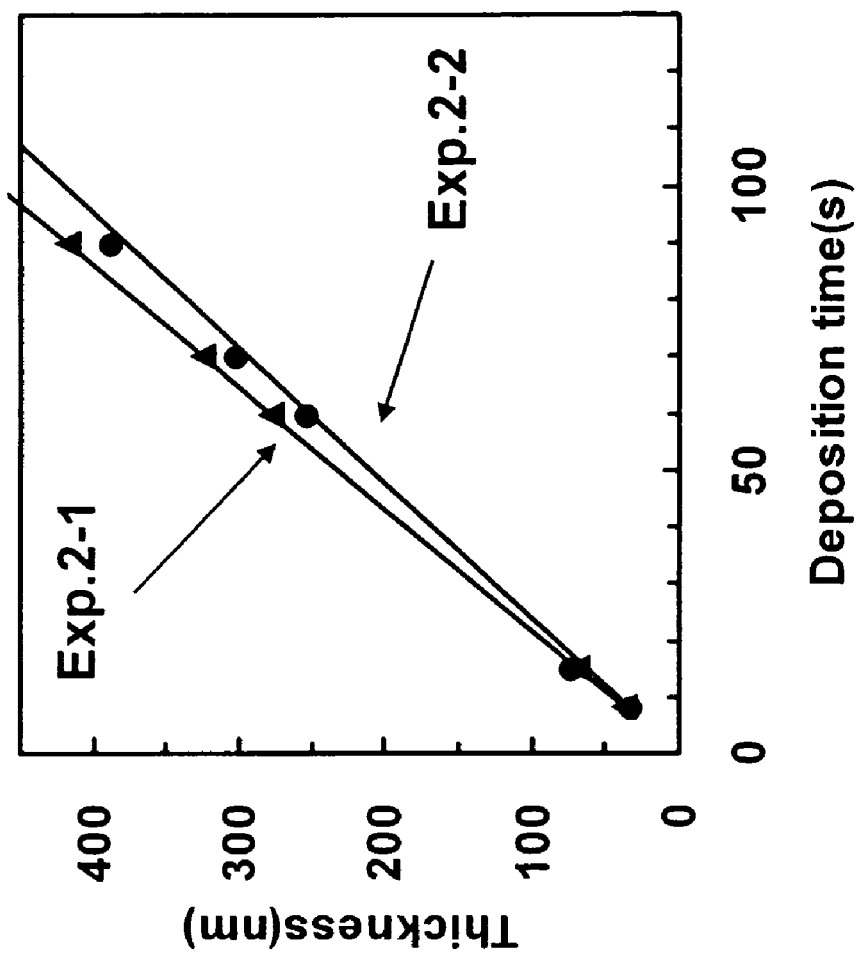
FIG. 5 is a graph showing an example of the relation between film formation time and a film thickness of a hydrocarbon-containing polymer film measured in an embodiment of the present invention.

Process Conditions in this Example and Film Formation Results are Shown as Follows:

Process Conditions:
Precursor: Isoprene(2-methyl-1,3-butadiene): 120 sccm
Ar supplied to vaporizer: 2 slm
Temperature of vaporizer, vaporizer portion: 80° C.
Controlled temperature of gas inlet piping: 100° C.
Process gas He supplied to reactor: 2 slm
RF Power 13.56 MHz: 1600 W
Pressure: 700 Pa
Film formation time: 60 sec
Film Formation Results:
Thickness: 250 nm
RI(n)@633 nm: 1.95
RI(k)@633 nm: 0.17
Density: 1.43 g/cm$^3$
Modulus: 49 GPa
Hardness: 8 GPa Additionally, FIG. 5 shows relation of film formation time and a thickness of a film formed obtained under the same conditions as in Examples 2-1 and 2-2. A film thickness is proportional to the film formation time; it was confirmed that thin films having a thickness from approximately 30 nm to approximately 400 nm were formed with satisfactory controllability. Additionally, modulus, hardness of carbon polymer films obtained were all satisfactory and it is seen that the carbon polymer films obtained are suitable for a hard mask.

EXAMPLE 2-3

Figure 6:
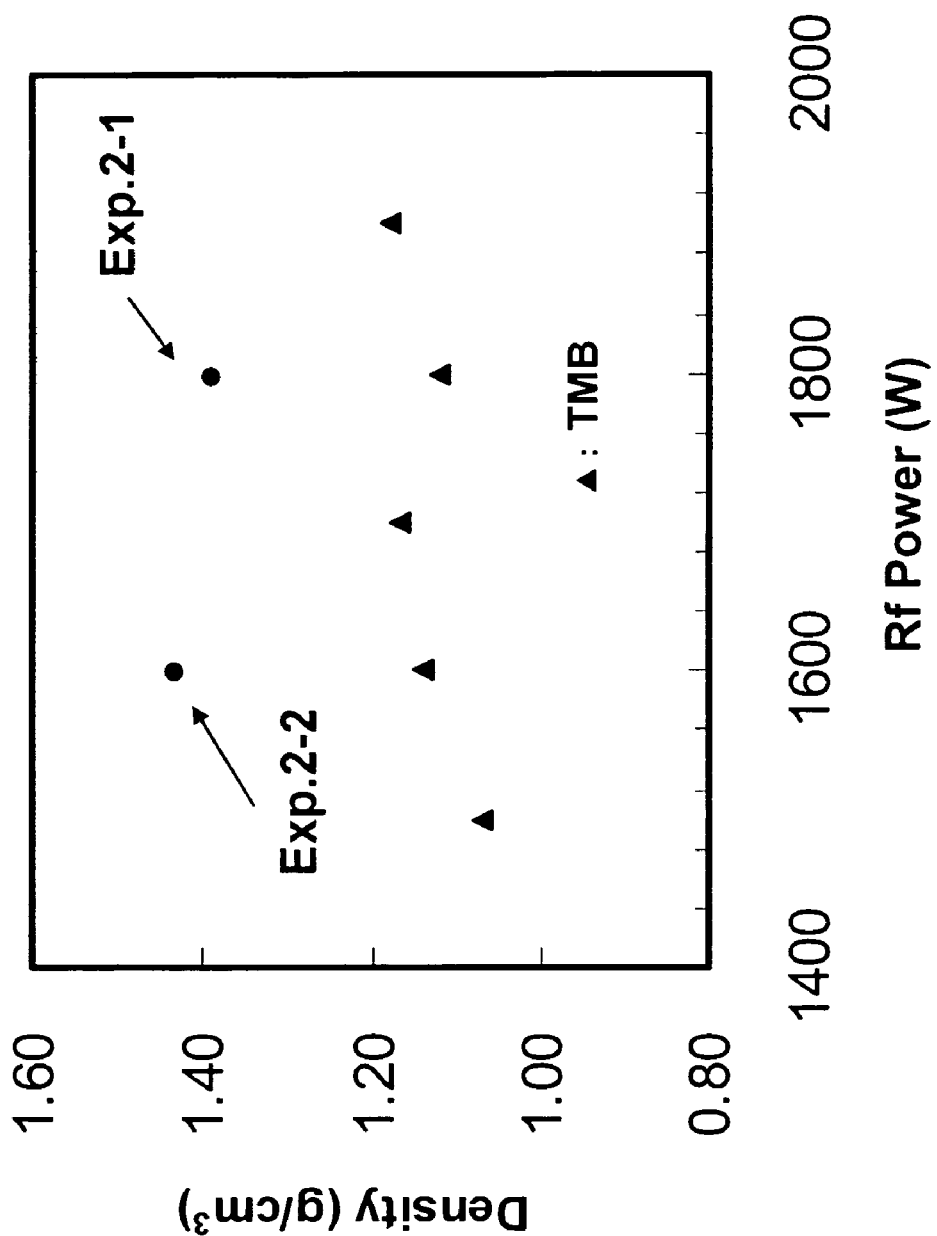
FIG. 6 is a graph showing an example of the relation between film density and RF power in embodiments of the present invention.

Process Conditions in this Example and Film Formation Results are Shown as Follows:

Process Conditions:
Precursor: TMB: 120 sccm
Ar supplied to vaporizer: 2 slm
Temperature of vaporizer, vaporizer portion: 140° C.
Controlled temperature of gas inlet piping: 140° C.
Process gas He supplied to reactor: 2 slm
RF Power 13.56 MHz: 1700 W
Pressure: 700 Pa
Film formation time: 65 sec
Film Formation Results:
Thickness: 250 nm
RI(n)@633 nm: 1.81
RI(k)@633 nm: 0.07
Density: 1.17 g/cm$^3$
Modulus: 14 GPa
Hardness: 2.2 GPa FIG. 6 shows relation of film density and RF power when films were formed under the same conditions as in Examples 2-1 (non-cyclic), 2-2 (non-cyclic), and 2-3 (TMB). The densities of films using TMB ranged 1.0 to 1.2 g/cm$^3$, whereas the densities of films using the non-cyclic liquid monomers were as high as approximately 1.40 g/cm$^3$ (in embodiments, 1.30 g/cm$^3$ to 1.55 g/cm$^3$).

As described above, the present invention includes at least the following embodiments:

1) A method of forming a hydrocarbon-containing polymer film on a semiconductor substrate by a capacitively-coupled plasma CVD apparatus, which comprises the steps of: vaporizing a hydrocarbon-containing liquid monomer ($C_\alpha H_\beta X_\gamma$, wherein $\alpha$ and $\beta$ are natural numbers of 5 or more; $\gamma$ is an integer including zero; X is O, N or F) having a boiling point of about 20° C. to about 350° C. which is not substituted by a vinyl group or an acetylene group, introducing the vaporized gas into a CVD reaction chamber inside which a substrate is placed, and forming a hydrocarbon-containing polymer film on the substrate by plasma polymerizing the gas.

2) The method described in 1) above, wherein the liquid monomer is cyclic hydrocarbon.

3) The method described in 2) above, wherein the cyclic hydrocarbon is substituted or non-substituted benzene.

4) The method described in 3) above, wherein the substituted or non-substituted benzene is $C_6H_{6-n}R''$, (wherein n is 0, 1, 2, or 3); R is independently —CH3 or —C2H5.

5) The method described in 4) above, wherein the liquid monomer is a combination of two types or more of substituted or non-substituted benzene.

6) The method described in 4) above, wherein the substituted benzene is any one of 1.3.5-trimethylbenzene, o-xylene, m-xylene or p-xylene.

7) The method described in 2) above, wherein the cyclic hydrocarbon is any one of cyclohexane, cyclohexene, cyclohexadiene, cyclooctatetraene, pentane, iso-pentane, or neopentane.

8) The method described in 1) above, wherein the liquid monomer is linear hydrocarbon.

9) The method described in 8) above, wherein the linear hydrocarbon is hexane.

10) The method described in 1) above, wherein the liquid monomer is hydrocarbon wherein $\gamma$ is equal to zero.

11) The method described in 1) above, wherein only the liquid monomer is used as a reaction gas.

12) The method described in 1) above, wherein the liquid monomer is introduced into a heater disposed upstream of the reaction chamber and vaporized.

13) The method described in 12) above, wherein the liquid monomer is flow-controlled upstream of the heater by a valve, and its introduction into the heater is blocked by a shutoff valve disposed between the flow control valve and the heater and kept approximately at 80° C. or lower or at a temperature lower than that of heating/vaporization by approximately 50° C. or more except when a film is being formed.

14) The method described in 12) above, wherein the liquid monomer is flow-controlled by a valve, which is disposed upstream of the heater and kept at approximately 80° C. or lower or at a temperature lower than that of heating/vaporization by approximately 50° C. or more, and its introduction into the heater is blocked except when a film is being formed.

15) The method described in 13) and 14) above, wherein the liquid monomer is mixed with an inert gas downstream of the valve and upstream of the heater.

16) The method described in 1) above, further comprising introducing an inert gas into the reaction chamber before the plasma polymerization.

17) The method described in 16) above, wherein the inert gas is one of or a combination of two or more of Ar, He, Ne, Kr, Xe and N2.

18) The method described in 1) above, wherein as an additive gas, an organic gas CnHm (wherein n is an integer of 4 or less including zero; m is any natural number) is further introduced into the reaction chamber.

19) The method described in 1) above, wherein as an additive gas, a dry gas containing N, O and F is further introduced into the reaction chamber.

20) The method described in 1) above, wherein the plasma polymerization is preformed under the conditions of a substrate temperature of approximately 0° C.-approximately 650° C., a reaction pressure of approximately 10 Pa-approximately 1500 Pa, RF power density of approximately 0.01 W/cm2-approximately 20 W/cm2.

21) The method described in 1) above, wherein the plasma polymerization step is preformed using high RF power of 13.56 MHz, 27 MHz, or 60 MHz.

22) The method described in 21) above, wherein one of the high RF power frequencies and a low RF frequency of 5 MHz or less are combined.

23) The method described in 1) above, wherein the substrate is a semiconductor device substrate.

24) A method of forming a hydrocarbon-containing polymer film on a semiconductor substrate by a capacitively-coupled plasma CVD apparatus, which comprises the steps of: Placing a semiconductor device substrate in a CVD reaction chamber, vaporizing a hydrocarbon-containing liquid monomer ($C_\alpha H_\beta X_\gamma$, wherein $\alpha$ and $\beta$ are natural numbers of 5 or more; $\gamma$ is an integer including zero; X is O, N or F) having a boiling point of about 20° C. to about 350° C., introducing the vaporized gas into the CVD reaction chamber inside which the substrate is placed, and forming a hard mask comprising a hydrocarbon-containing polymer film on the substrate by plasma polymerizing the gas.

25) The method described in 24) above, wherein the liquid monomer is cyclic hydrocarbon.

26) The method described in 25) above, wherein the cyclic hydrocarbon is substituted or non-substituted benzene.

27) The method described in 25) above, wherein the substituted or non-substituted benzene is $C_6H_{6-n}R_n$ (wherein n is 0, 1, 2, or 3); R is independently —CH3 or —C2H5, or —CH=CH2.

28) The method described in 27) above, wherein the liquid monomer is a combination of two types or more of substituted or non-substituted benzene.

29) The method described in 25) above, wherein the substituted benzene is any one of 1.3.5-trimethylbenzene, o-xylene, m-xylene or p-xylene.

30) The method described in 25) above, wherein the cyclic hydrocarbon is any one of cyclohexene, cyclohexadiene, cyclooctatetraene, pentane, iso-pentane, or neo-pentane.

31) The method described in 24) above, wherein the liquid monomer is linear hydrocarbon.

32) The method described in 31) above, wherein the linear hydrocarbon is pentane, iso-pentane, neo-pentane, hexane, 1-pentene, 1-hexene, or 1-pentyne.

33) The method described in 24) above, wherein the liquid monomer is hydrocarbon wherein $\gamma$ is equal to zero.

34) The method described in 24) above, wherein only the liquid monomer is used as a reaction gas.

35) The method described in 24) above, wherein the liquid monomer is introduced into a heater disposed upstream of the reaction chamber and vaporized.

36) The method described in 35) above, wherein the liquid monomer is flow-controlled upstream of the heater by a valve, and its introduction into the heater is blocked by a shutoff valve disposed between the flow control valve and the heater and kept approximately at 80° C. or lower or at a temperature lower than that of heating/vaporizing by approximately 50° C. or more except when a film is being formed.

37) The method described in 35) above, wherein the liquid monomer is flow-controlled by a valve, which is disposed upstream of the heater and kept at approximately at 80° C. or lower or at a temperature lower than that of heating/vaporization by approximately 50° C. or more, and its introduction into the heater is blocked except when a film is formed.

38) The method described in 36) or 37) above, wherein the liquid monomer is mixed with an inert gas downstream of the valve and upstream of the heater.

39) The method described in 24) above, further comprising introducing an inert gas into the reaction chamber before the plasma polymerization.

40) The method described in 39) above, wherein the inert gas is one of or a combination of two or more of Ar, He, Ne, Kr, Xe and N2.

41) The method described in 24) above, wherein as an additive gas, an organic gas CnHm (wherein n is an integer of 4 or less including zero; m is any natural number) is further introduced into the reaction chamber.

42) The method described in 24) above, wherein as an additive gas, a dry gas containing N, O and F is further introduced into the reaction chamber.

43) The method described in 24) above, wherein the plasma polymerization step is preformed under the conditions of a substrate temperature of approximately 0° C.-approximately 650° C., a reaction pressure of approximately 10 Pa-approximately 1500 Pa, RF power density of approximately 0.01 W/cm2-approximately 20 W/cm2.

44) The method described in 24) above, wherein the plasma polymerization is preformed using high RF power of 13.56 MHz, 27 MHz, or 60 MHz.

45) The method described in 44) above, wherein one of the high RF power frequencies and a low RF frequency of 5 MHz or less are combined.

46) A method of forming a hydrocarbon-containing polymer film on a semiconductor substrate by a capacitively-coupled plasma CVD apparatus, which comprises the steps of: Introducing a hydrocarbon-containing liquid monomer ($C_\alpha H_\beta X_\gamma$, wherein $\alpha$ and $\beta$ are natural numbers of 5 or more; $\gamma$ is an integer including zero; X is O, N or F) having a boiling point of approximately 20° C.-approximately 350° C. into a heater through a flow control valve and further through a shutoff valve disposed downstream of the flow control valve and kept at approximately 80° C. or lower and vaporizing it, introducing the vaporized gas into a CVD reaction chamber inside which the substrate is placed, and forming a hydrocarbon-containing polymer film on the substrate by plasma polymerizing the gas.

47) The method described in 46) above, wherein the liquid monomer is mixed with an inert gas downstream of the shut-off valve and upstream of the heater.

48) The method described in 46) above, further comprising shutting off the shutoff valve after completion of film formation to block inflow of the liquid monomer into the heater.

49) The method described in 48) above, wherein after shutting off the shutoff valve, inside the heater is purged by an inert gas.

50) The method described in 46) above, wherein the liquid monomer is cyclic hydrocarbon.

51) The method described in 50) above, wherein the cyclic hydrocarbon is substituted or non-substituted benzene.

52) The method described in 51) above, wherein the substituted or non-substituted benzene is $C_6H_{6-n}R_n$ (wherein n is 0, 1, 2, or 3); R is independently —CH3, —C2H5, or —CH=CH2.

53) A method of forming a hydrocarbon-containing polymer film on a semiconductor substrate by a capacitively-coupled plasma CVD apparatus, which comprises the steps of: vaporizing a hydrocarbon-containing liquid monomer ($C_\alpha H_\beta X_\gamma$, wherein $\alpha$ and $\beta$ are natural numbers of 5 or more; $\gamma$ is an integer including zero; X is O, N or F) having a boiling point of about 20° C. to about 350° C. and having no benzene structure; introducing said vaporized gas into a CVD reaction chamber inside which a substrate is placed; and forming a hydrocarbon-containing polymer film on said substrate by plasma polymerization of said gas.

54) The method described in 53), wherein the liquid monomer is a hydrocarbon monomer of $C_nH_{2(n-m)+2}$ (n is an integer of 5 or greater, m is an integer of 1 or greater but smaller than n).

55) The method described in 53), wherein the liquid monomer is an unsaturated hydrocarbon monomer which is a butadiene monomer of $C_4H_{6-n}(CH_3)_n$ (n is an integer of 1 or greater).

56) The method described in 53), wherein the liquid monomer is a saturated hydrocarbon monomer of $C_nH_{2n+2}$ (n is an integer of 5 or greater).

57) The method described in 55), wherein the butadiene monomer is isoprene(2-methyl-1,3-butadiene), CH₂=C(CH₃)CH=CH₂($C_5H_8$).

58) The method described in 55), wherein the butadiene monomer is 2,3-methyl-1,3-butadiene, CH₂=C(CH₃)C(CH₃)=CH₂($C_6H_{10}$).

59) The method described in 53), wherein the liquid monomer is composed of two or more different liquid monomers.

60) The method described in 53), wherein the liquid hydrocarbon monomer is any one of organic monomers selected from the group consisting of 3-methyl-1,2-butadiene, $C_5H_{10}$ (e.g., 2-methyl-1-butene, 2-methyl-2-butene, or 3-methyl-1-butene), 1,4-methyl-1,3-butadiene, and 1,2-methyl-1,3-butadiene.

61) The method described in 53), wherein only the liquid monomer is used as a source gas.

62) The method described in any preceding methods, wherein the liquid monomer is introduced into a heater disposed upstream of the reaction chamber and vaporized, wherein the liquid monomer is flow-controlled upstream of the heater by a valve, and its introduction into the heater is blocked, except when a film is being formed, by a shutoff valve disposed between the flow control valve and the heater and kept approximately at 50° C. or lower.

63) The method described in any preceding methods, wherein all or part of primary piping of a liquid control unit, a liquid supplier, piping from the liquid supplier to a liquid shut-off valve, and the liquid shut-off valve are subjected to cooling control to be cooled at 30° C. or lower.

64) The method described in 63), wherein all or part of the primary piping of the liquid control unit, the liquid supplier, the piping from the liquid supplier to the liquid shut-off valve, and the liquid shut-off valve are subjected to cooling control to be cooled at 20° C. or lower.

65) The method described in any preceding methods, wherein the liquid monomer is mixed with an inert gas at a position downstream of the shut-off valve and upstream of the heater.

66) The method described in any preceding methods, wherein the interior of the heater is purged with an inert gas after the shut-off valve is closed.

67) The method described in 53), wherein the liquid monomer is mixed further with one inert gas or two or more inert gases in combination which are selected from the group consisting of Ar, He, Ne, Kr, Xe, and $N_2$, and then introduced into the reaction chamber.

68) The method described in 53) or 65), wherein as an additive gas, an organic gas of CnHm (n is an integer of 4 or less including zero, m is any given natural number) is further introduced into the reaction chamber.

69) The method described in 53) or 65), wherein as an additive gas, a dry gas containing N, O and F is further introduced into the reaction chamber.

70) The method described in 53), wherein the plasma polymerization is preformed under the conditions of a substrate temperature of approximately 0° C.-approximately 650° C., a reaction pressure of approximately 10 Pa-approximately 1500 Pa, RF power density of approximately 0.01 W/cm²-approximately 20 W/cm².

71) The method described in 53), wherein the plasma polymerization is preformed under the conditions of a substrate temperature of approximately 200° C.-approximately 600° C., a reaction pressure of approximately 10 Pa-approximately 1500 Pa, RF power density of approximately 0.1 W/cm²-approximately 5 W/cm².

72) The method described in 53), wherein the plasma polymerization step is preformed using high RF power of 13.56 MHz, 27 MHz, or 60 MHz.

73) The method described in 53), wherein one of the high RF power frequencies and a low RF frequency of 5 MHz or less are combined.

74) The method described in 53), wherein the substrate is a semiconductor substrate.

75) A method of forming a hydrocarbon-containing polymer film on a semiconductor substrate by a capacitively coupled plasma CVD apparatus, which comprises the steps of: vaporizing a hydrocarbon-containing liquid monomer ($C_\alpha H_\beta X_\gamma$, wherein $\alpha$ and $\beta$ are natural numbers of 5 or more; $\gamma$ is an integer including zero; X is O, N or F) having a boiling point of about 20° C. to about 350° C. and having no benzene structure; introducing said vaporized gas into a CVD reaction chamber inside which a substrate is placed; and forming a hard mask comprising a hydrocarbon-containing polymer film on said substrate by plasma polymerization of said gas.

76) The method described in 75), wherein the liquid monomer is a saturated hydrocarbon.

77) The method described in 75), wherein the liquid monomer is a hydrocarbon monomer of $C_nH_{2(n-m)+2}$ (n is an integer of 5 or greater, m is an integer of 1 or greater but smaller than n).

78) The method described in 75), wherein the liquid monomer is a saturated hydrocarbon monomer of $C_nH_{2n+2}$ (n is an integer of 5 or greater).

79) The method described in 75), wherein the liquid monomer is an unsaturated hydrocarbon monomer which is a butadiene monomer of $C_4H_{6-n}(CH_3)_n$ (n is an integer of 1 or greater).

80) The method described in 79), wherein the butadiene monomer is isoprene(2-methyl-1,3-butadiene), $CH_2=C(CH_3)CH=CH_2(C_5H_8)$.

81) The method described in 79), wherein the butadiene monomer is 2,3-methyl-1,3-butadiene, $CH_2=C(CH_3)C(CH_3)=CH_2(C_6H_{10})$.

82) The method described in 75), wherein the liquid monomer is composed of two or more different liquid monomers.

83) The method described in 75), wherein the liquid hydrocarbon monomer is any one of organic monomers selected from the group consisting of 3-methyl-1,2-butadiene, $C_5H_{10}$ (e.g., 2-methyl-1-butene, 2-methyl-2-butene, or 3-methyl-1-butene), 1,4-methyl-1,3-butadiene, and 1,2-methyl-1,3-butadiene.

84) The method described in 75), wherein only the liquid monomer is used as a source gas.

85) The method described in any preceding methods, wherein the liquid monomer is introduced into a heater disposed upstream of the reaction chamber and vaporized, wherein the liquid monomer is flow-controlled upstream of the heater by a valve, and its introduction into the heater is blocked, except when a film is being formed, by a shutoff valve disposed between the flow control valve and the heater and kept approximately at 50° C. or lower.

The method described in any preceding methods, wherein all or part of primary piping of a liquid control unit, a liquid supplier, piping from the liquid supplier to a liquid shut-off valve, and the liquid shut-off valve are subjected to cooling control to be cooled at 30° C. or lower.

87) The method described in any preceding methods, wherein all or part of the primary piping of the liquid control unit, the liquid supplier, the piping from the liquid supplier to the liquid shut-off valve, and the liquid shut-off valve are subjected to cooling control to be cooled at 20° C. or lower.

88) The method described in 75), wherein the liquid monomer is mixed further with one inert gas or two or more inert gases in combination which are selected from the group consisting of Ar, He, Ne, Kr, Xe, and $N_2$, and then introduced into the reaction chamber.

89) The method described in 75) or 88), wherein as an additive gas, an organic gas of CnHm (n is an integer of 4 or less including zero, m is any given natural number) is further introduced into the reaction chamber.

90) The method described in 75) or 88), wherein as an additive gas, a dry gas containing N, O and F is further introduced into the reaction chamber.

91) The method described in 75), wherein the plasma polymerization is preformed under the conditions of a substrate temperature of approximately 0° C.-approximately 650° C., a reaction pressure of approximately 10 Pa-approximately 1500 Pa, RF power density of approximately 0.01 W/cm²-approximately 20 W/cm².

92) The method described in 75), wherein the plasma polymerization is preformed under the conditions of a substrate temperature of approximately 200° C.-approximately 600° C., a reaction pressure of approximately 10 Pa-approximately 1500 Pa, RF power density of approximately 0.1 W/cm²-approximately 5 W/cm².

93) The method described in 75), wherein the plasma polymerization step is preformed using high RF power of 13.56 MHz, 27 MHz, or 60 MHz.

94) The method described in 75), wherein one of the high RF power frequencies and a low RF frequency of 5 MHz or less are combined.

95) The method described in any preceding methods, wherein the liquid monomer is mixed with an inert gas at a position downstream of the shut-off valve and upstream of the heater.

96) The method described in any preceding methods, further comprising blocking the liquid monomer from flowing into the heater by closing the shut-off valve, after the completion of the film formation.

97) The method described in any preceding methods, wherein the interior of the heater is purged with an inert gas after the shut-off valve is closed.

In the present disclosure where conditions and/or structures are not specified, the skilled artisan in the art can readily provide such conditions and/or structures, in view of the present disclosure, as a matter of routine experimentation.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming a hydrocarbon-containing polymer film on a semiconductor substrate by a capacitively-coupled plasma CVD apparatus, which comprises:
   introducing a hydrocarbon-containing liquid monomer ($C_\alpha H_\beta X_\gamma$, wherein $\alpha$ and $\beta$ are natural numbers of 5 or more; $\gamma$ is an integer including zero; X is O, N or F) having a boiling point of about 20° C. to about 350° C. and having no benzene structure, into a heater to vaporize the liquid monomer, wherein said non-benzene liquid monomer is flow-controlled upstream of said heater by a flow control valve, and its introduction into said heater is blocked, except when the formation of a hydrocarbon-containing polymer film is ongoing, by a shutoff valve disposed between said flow control valve and said heater and kept approximately at 50° C. or lower;
   introducing said vaporized gas into a CVD reaction chamber inside which a substrate is placed; and
   forming a hydrocarbon-containing polymer film on said substrate by plasma polymerization of said gas.

2. The method according to claim 1, wherein said non-benzene liquid monomer is non-cyclic.

3. The method according to claim 1, wherein said non-benzene liquid monomer is a hydrocarbon wherein $\gamma$ is equal to zero.

4. The method according to claim 1, wherein said non-benzene liquid monomer is an unsaturated hydrocarbon.

5. The method according to claim 4, wherein said unsaturated hydrocarbon is selected from the group consisting of isoprene(2-methyl-1,3-butadiene), 2,3-methyl-1,3-butadiene, 3-methyl-1,2-butadiene, 2-methyl-1-butene, 2-methyl-2-butene, 3-methyl-1-butene, 1,4-methyl-1,3-butadiene, and 1,2-methyl-1,3-butadiene.

6. The method according to claim 1, wherein said non-benzene liquid monomer is a saturated hydrocarbon.

7. The method according to claim 2, wherein said non-cyclic liquid monomer is one or more hydrocarbons selected from the group consisting of $C_nH_{2n+2}$ (n is an integer of 5 or greater) and $C_nH_{2(n-m)+2}$ (n is an integer of 5 or greater, m is an integer of 1 or greater but smaller than n).

8. The method according to claim 1, wherein only said non-benzene liquid monomer is used as a reaction gas.

9. The method according to claim 1, further comprising introducing an inert gas into the reaction chamber prior to the plasma polymerization.

10. The method according to claim 1, wherein as an additive gas, an organic gas CnHm (wherein n is an integer of 4 or less including zero; m is any natural number) is further introduced into the reaction chamber.

11. The method according to claim 1, wherein as an additive gas, a dry gas containing N, O, and/or F is further introduced into the reaction chamber.

12. The method according to claim 1, wherein the forming polymer film has a density of 1.2 g/cm$^3$ to 2.2 g/cm$^3$.

13. The method according to claim 1, wherein the forming polymer film is a hard mask.

14. The method according to claim 1, further comprising introducing an inert gas downstream of the shut-off valve to mix the liquid monomer and the inert gas upstream of the heater.

15. The method according to claim 14, further comprising purging the heater with the inert gas upon closing the shutoff valve.

* * * * *

UNITED STATES PATENT AND TRADEMARK OFFICE
CERTIFICATE OF CORRECTION

PATENT NO.         : 7,470,633 B2
APPLICATION NO.    : 11/524037
DATED              : December 30, 2008
INVENTOR(S)        : Matsuki et al.

It is certified that error appears in the above-identified patent and that said Letters Patent is hereby corrected as shown below:

At Column 7, line 19, after "35°C.," change "a" to --and--, therefor.

At Column 14, line 10, change "50 sccm X" to --50 sccm--, therefor.

At Column 16, line 37(approx.), change "$C_6H_{6-n}R^n$," to -- $C_6H_{6-n}R_n$,--, therefor.

At Column 21, line 30, before "The" insert --86)--, therefor.

Signed and Sealed this

Twenty-first Day of April, 2009

JOHN DOLL
*Acting Director of the United States Patent and Trademark Office*